(12) United States Patent
Allen, III et al.

(10) Patent No.: US 6,939,727 B1
(45) Date of Patent: Sep. 6, 2005

(54) METHOD FOR PERFORMING STATISTICAL POST PROCESSING IN SEMICONDUCTOR MANUFACTURING USING ID CELLS

(75) Inventors: Ernest Allen, III, Hillsboro, OR (US); David Castaneda, Clackamas, OR (US); Miaw Looi, Hillsbor, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/701,328

(22) Filed: Nov. 3, 2003

(51) Int. Cl.[7] .................. H01L 31/26; H01L 21/66
(52) U.S. Cl. .............................. 438/14; 438/68
(58) Field of Search .................. 438/14, 17, 18, 438/33, 58, 66, 68, 100, 101

(56) References Cited

U.S. PATENT DOCUMENTS

| | | | | |
|---|---|---|---|---|
| 5,206,171 A | * | 4/1993 | Dillon et al. | 435/286.3 |
| 5,557,573 A | * | 9/1996 | McClure | 365/201 |
| 6,161,213 A | | 12/2000 | Lofstrom | 716/4 |
| 6,714,031 B2 | * | 3/2004 | Seki | 324/763 |

* cited by examiner

*Primary Examiner*—Phuc T. Dang
(74) *Attorney, Agent, or Firm*—Beyer Weaver Thomas

(57) ABSTRACT

A method of manufacturing a semiconductor integrated circuit includes providing a fabricated integrated circuit on a wafer. A test fixture is connected to unencapsulated pads on the integrated circuit to monitor an operating parameter for the circuit and to determine a unique identifier for the die. The parameter is analyzed in post processing.

24 Claims, 6 Drawing Sheets

METHOD FOR PERFORMING STATISTICAL POST PROCESSING IN SEMICONDUCTOR MANUFACTURING USING ID CELLS

BACKGROUND OF THE INVENTION

1. Field of the Invention

The present invention relates to processes involved in the manufacturing of semiconductor devices. More particularly, the present invention relates to methods for testing integrated circuits.

2. Description of the Related Art

As integrated circuit devices grow smaller and smaller, the testing of the integrated circuits presents greater challenges. For example, the shrinkage of transistor sizes to the point that critical dimensions are well below one micron ($10^{-6}$ m), has resulted in more elaborate and expensive testing fixtures to probe the contacts on the wafer during testing steps.

Semiconductor wafer fabrication involves a series of processes used to create semiconductor devices and integrated circuits (IC's) in and on a semiconductor wafer surface. Fabrication typically involves the basic operations of layering and patterning, together with others such as doping, and heat treatments. Typically, a large number of dies are formed on a wafer using these methods. Many of these dies may have defects occurring during the fabrication process, for example during the patterning of layers, which affect the reliability of the die. Some defects, for example, directly affect the functionality of the circuit resulting in functional failure. Other defects may adversely affect the reliability of the circuit resulting in an early lifetime failure or failure under varying operating conditions.

Conventional manufacturing methods, as illustrated in FIG. 1, include fabrication, wafer sort or probing, assembly or packaging, and testing performed in sequence. As discussed above, the fabrication operation 102 forms the individual dies onto a semiconductor wafer. The wafer is often 300 mm or more in diameter and typically includes a large number of integrated circuits or dies on the wafer. For example, a single wafer may produce 50 to 200 or more identical integrated circuit dies.

Each of the individual dies is then tested to determine its operability, that is, to determine if the chips function in accordance with the design. This step is typically performed at wafer sort or probe 104. During this step the unencapsulated die are tested while still part of the wafer. The wafer prober usually involves a material handling system to transfer wafers from their carriers to a flat chuck and aligns them precisely under a set of fine contacts or probe tips on a probe card. The probe card, provides interconnection between the die pads and a load card which is connected to automated test equipment (ATE). The probe card thus acts as an interface between the metallic pads on the dies and provides connections to the tester. The functional tester or automatic test equipment (ATE) is capable of functionally exercising all of the chip's designed features under software control. Any failure to meet the published specification is identified by the tester and the device is cataloged as a reject. Thus, both good and bad dies may be determined. Bad dies are often marked by either a probe or ink mark at the wafer sort operation.

Next, as illustrated in operation 106, the assembly of the chips takes place. Typically, the wafer is diced, i.e., sawn along "streets" of the wafer to form individual die. The "streets" or scribe lines lie between each die and are used as cutting lines during the wafer sawing operation. During the assembly step, the die is separated from the wafer and packaged to form a device that can be attached and electrically connected to a printed circuit board, for example. Thus, the assembly operation includes a number of sub-steps such as wafer sawing, die attachment, and bonding.

During the package testing operation 108, a final opportunity is presented to test the functioning of the chips (die). This is also referred to as final test. Typically a material handling system transfers packaged dies from their carriers and loads them into contacts or sockets on a load board. The functional tester or automatic test equipment (ATE) then functionally exercises the chip's designed features under software control to identify defective die.

Unfortunately, the wafer probe operation is a very delicate and time consuming operation requiring a great deal of skill. As discussed, electrical contacts between the metallic pads on the dies positioned on the wafer and the tester is achieved by using a probe card. The probe card is a customized printed circuit board designed to match the bonding pad geometry of each die and connect it to the test equipment. The wafer can then be moved either manually or automatically by the machine in both vertical and horizontal directions. The probe card includes thin metal probes which make the connection between the card's circuit, i.e., the printed circuit board portion of the probe card, and the die bonding pads. By lowering these probes onto the metallic contact pads of each die, an electrical connection is made for functionally exercising the die under a test program generated by the tester. Since probe cards must be custom built for each new integrated circuit design to match the particular metallic pad configuration for that design, expenditures for probe cards can be substantial. For example, at the time of the drafting of this specification, probe cards costs are as much as eighty thousand dollars or higher.

Unfortunately, the production run of the dies may be of a small volume, and thus building test fixtures (such as probe cards) that are specific to the design may not be economically justified. This is particularly the case for some Application-Specific Integrated Circuit (ASIC) manufacturing flows, and for prototype designs.

For example, the total anticipated production volume of the ASIC may be only a few thousand units. If the expected yield at wafer probe is on the order of ninety percent, it would make far more sense to skip the wafer probe test step entirely in favor of testing the die in its packaged form.

Once the die has been assembled in its final packaged form, the functioning of the die may be performed at the final test step. Final testing does not require the dedicated, custom fixtures such as probe cards for testing, since many designs which are quite different in die form may still share the same package and the same arrangement of power and ground planes in the package.

Unfortunately, skipping the wafer sort step results in the loss of information regarding the original location of the die a particular wafer. For example, it is quite common to have 'rogue' wafers appearing from time to time in an otherwise normal wafer lot. A rogue wafer might yield very poorly at the wafer probe step, i.e., falling far outside the specifications due to a process irregularity, and might result in a decision that the entire wafer represents a process excursion that should be completely contained and not shipped to the customer. But if the wafer sort step was skipped, such information pertinent to all of the dies on the wafer would not otherwise be available at the final test step. That is, a slightly depressed yield at final test will not provide sufficient information to determine that all units built from a given wafer should be rejected, even if individual package die could be correlated to a particular wafer.

Accordingly, it is desirable to provide a more effective and economical screening and evaluation method for detecting defects in die.

SUMMARY OF THE INVENTION

To achieve the foregoing, the present invention provides methods for detecting fabrication defects in devices.

The time and expense of customized wafer probe cards is avoided in one embodiment by providing a generic test interface, such as a variation of an electrical testing structure (i.e., e-test) probe card, the test fixture interface configured to provide electrical contact with pads and other contacts on the wafer. Data such as an identification number for the device can be thus monitored at the same time that the e-test structures located in the scribe streets are accessed. Further, an electrical parameter for the integrated circuit die, such as a supply current from a reference test cell located within the integrated circuit can also be monitored using the generic interface. Using this wafer level data, and optionally data obtained after the die si separated form the wafer, statistical post processing can be performed to identify wafer defect patterns.

According to one embodiment, a method of manufacturing a semiconductor integrated circuit is provided. A wafer having a plurality of integrated circuit dies is provided. A standardized test fixture contacts selected pads on the die positioned in a standardized location for determining a unique identification number for the die and for testing a parameter of the circuit. The test fixture also provides electrical contact with electrical testing structures (e-test) located in a scribe line adjacent to the die. The contacts on the die used in the test are located in a standardized geometric location relative to the electrical testing structures located in the scribe line. The electrical parameter includes one of supply voltage and current.

According to another embodiment, the identification number and location data pertaining to the integrated circuit die are used in post processing steps to identify defects in the plurality of dies and the patterns of the defects.

According to yet another embodiment, a standardized test fixture includes probe tips positioned in standardized locations for obtaining identifier and Idd current measurements for a family of integrated circuits.

According to yet another embodiment, an integrated circuit test fixture configured for interconnection between a semiconductor tester and a wafer includes a plurality of probe tips configured to provide electrical contact with a corresponding plurality of pads or contacts on a semiconductor wafer. A first group of the plurality of pads comprises pads connected to an identification cell located within an integrated circuit die on the wafer and a second group of the plurality of pads is connected to an electrical testing structure located in a scribe line adjacent to the die. Preferably, the plurality of pads are located in a corner of the integrated circuit die adjacent to the location of electrical testing structure located in a scribe line adjacent to the die. A third group of the plurality of pads is connected to a reference test cell located on the integrated circuit die and configured to measure an electrical parameter for the integrated circuit.

According to yet another embodiment, the method of manufacturing a semiconductor integrated circuit includes providing a plurality of integrated circuit dies on a wafer. An identification number is generated from an identification cell located on each of the plurality of dies. The identification number is monitored before separating the plurality of dies from the wafer by using a generic interface configured to access pads over a plurality of different integrated circuit designs. The monitored identification number is used in statistical post processing to identify defects in any of the plurality of dies. The test fixture provides removable contact with pads at uniform locations on the dies. The fixture also provides access to electrical testing structures located on scribe lines of the wafer. The pads are located at a constant geometric relationship with the E-test pads to obtain at least one of a unique identifier for the die and a test parameter while accessing e-test information.

These and other features and advantages of the present invention are described below with reference to the drawings.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In a preferred embodiment of the invention, a method of manufacturing a semiconductor integrated circuit includes providing a wafer having a plurality of dies formed on the wafer. The unencapsulated die includes at least one I.D. (identification) cell in the active die portion of the wafer. Pads for providing electrical connection to the circuitry of the die are positioned in a standard position on the die. The die is tested by applying a standard test fixture configured with contacts to provide electrical connection from the metallic pads on the die to the tester. According to one embodiment, the test fixture is a generic probe card, configured with probe tips to match the standard positions of die pads connected to ID cells and other test cells on the die.

Figure 1:
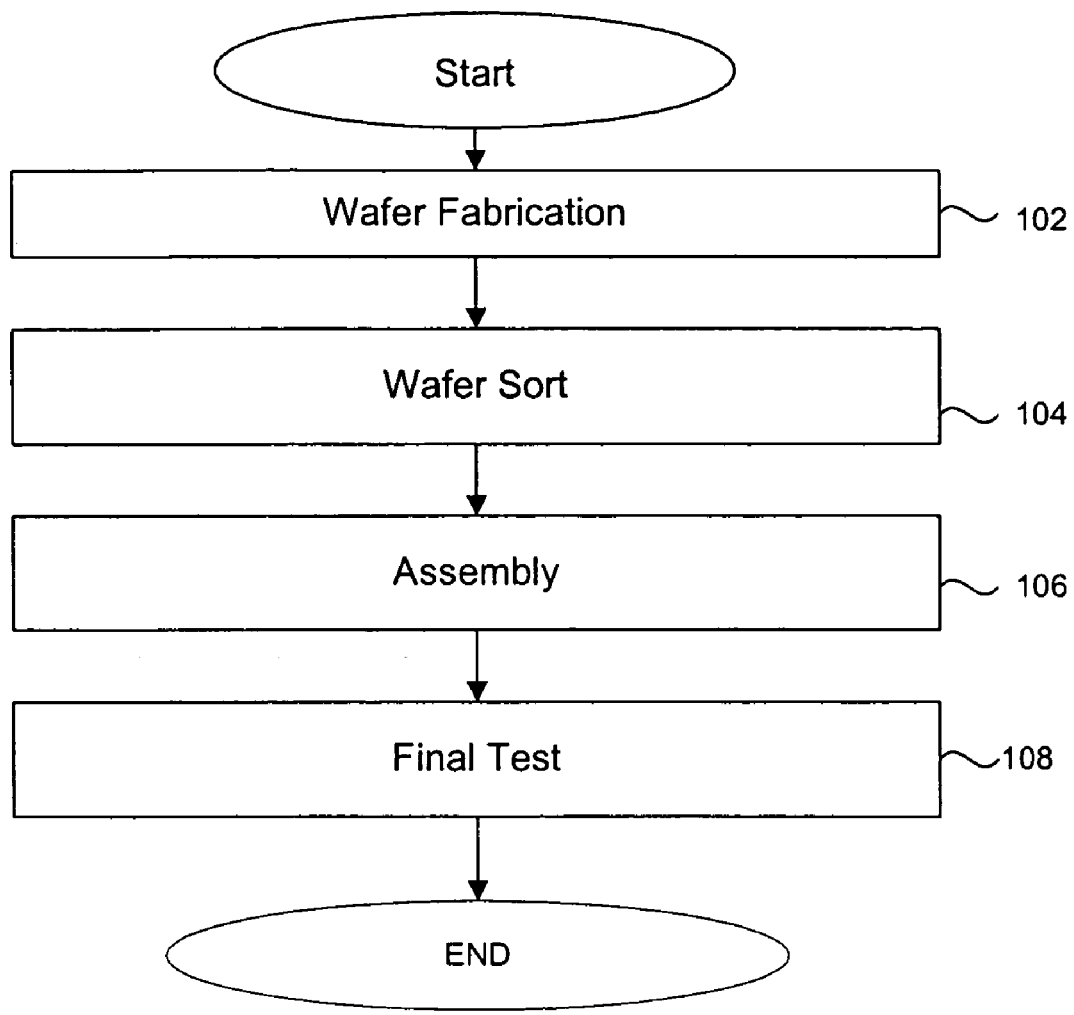
FIG. 1 is a flowchart illustrating conventional steps in the manufacturing of a semiconductor integrated circuit.
Figure 2A:
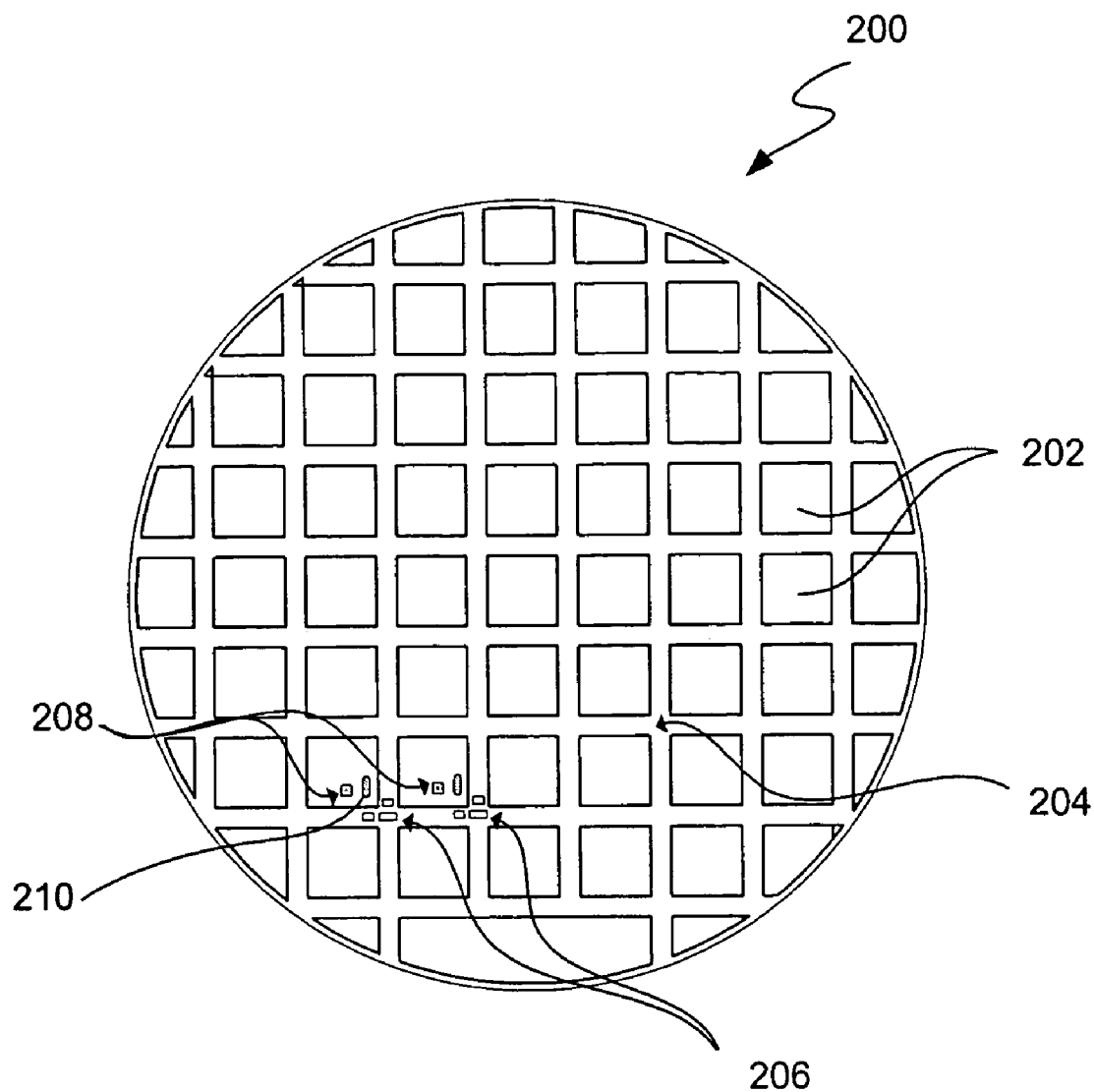
FIG. 2A is a diagram of a wafer configured with pads in standardized locations in accordance with one embodiment of the present invention.

FIG. 2A is a diagram of a wafer configured with pads in standardized locations in accordance with one embodiment of the present invention. The semiconductor wafer 200 includes a plurality of dies 202, separated by scribe lines or streets 204. One method of determining whether the process parameters fall within the accepted limits is to run verification tests, commonly referred to as E-tests. Accordingly, the wafer 200 includes E-test circuitry and pads 206 located within the street.

Figure 2B:
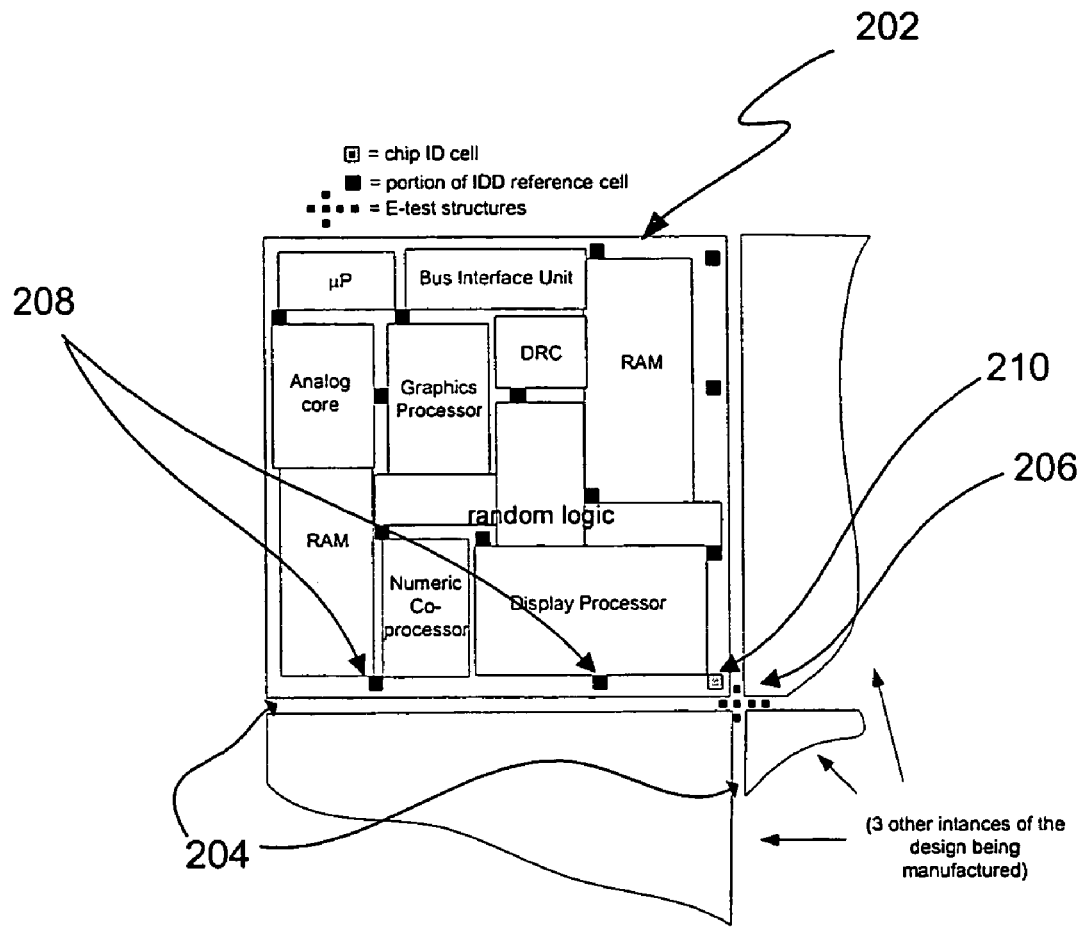
FIG. 2B is an expanded view of a die located on the wafer depicted in FIG. 2A, in accordance with one embodiment of the present invention.

FIG. 2B is an expanded view of a die located on the wafer depicted in FIG. 2A, in accordance with one embodiment of the present invention. The die 202 is illustrated as including a number of functional blocks, for example, a microprocessor, RAM, numeric co-processor and graphics processor, all of which are intended to be illustrative but not limiting as to the variety of functional circuits which may be found on a typical integrated circuit. Included within the die is a chip ID cell 210 and IDD reference cells 208. The ID cell 210 is configured to generate a random identifying number for each die on each wafer. Preferably the identifier is configured to generate sufficient bits (i.e., enough digits) so that the chance of an accidental duplication of two IDs during the manufacture of a large lot, for example ten million dies, will be remote.

Suitable identifiers are commercially available, for example including the integrated circuit identification device disclosed in further detail in U.S. Pat. No. 6,161,213, issued to Lofstrom, which application is herein incorporated by reference in its entirety for all purposes. The integrated circuit identification device described in the Lofstrom patent is described as an array of electronic cells in which the magnitude of the output signal of each cell is a function of randomly occurring parametric variations from cell to cell. The integrated circuit identification device described therein as well as others commercially available are believed to be suitable for use with the methods and test apparatus described herein. For this reason, further description of identifier cells here is deemed unnecessary. By incorporating the identifier cell into the die, the die may be traced through the manufacturing flow up to (or even beyond) the point that it ships to the customer. This provides identification information which may be correlated with measured data, such as performance data, which can be evaluated in statistical post-processing steps.

Semiconductor manufacturing typically performs end of line testing on completed wafers to evaluate die, for example to make decisions about evolving changes in the process and to improve yields. These tests include electrical or E-tests, designed to report parametric information about devices on the scribe line structures, i.e., the E-test structures. In order to maintain proper control of the fabrication process, certain areas of the scribe lines of each wafer are reserved for special circuits to perform the e-tests. This special circuitry includes transistors of known dimensions. Extremely precise analog tests are typically performed on these transistors and the results analyzed to provide control of the fabrication process.

These special circuits or e-test structures are not typically needed for subsequent manufacturing steps once the necessary e-test information is extracted. For this reason the e-test structures are usually placed in the 'scribe street' between dice, a region which is destroyed when the wafer is sawed up into separate dice. The structures in the scribe street are unpassivated or unencapsulated (not covered with a protective insulating layer), and they are tested conventionally with a dedicated probe card.

In a conventional wafer, the arrangement of the pads on these e-test structures is fixed for a given process. That is, only the spacing of the test structures, one from the other, changes to accommodate the different integrated circuit designs on the wafer. Thus, for conventionally configured wafers, one probe card will suffice for all devices manufactured on a given process, e.g. for a 130 nm process technology node.

Embodiments of the present invention provide a means for extracting the device ID (and similar information), without the necessity for a customized probe card or performing conventional wafer sort steps. In one embodiment, the device ID information is extracted during the electrical testing (E-testing) of the device.

The wafer of a preferred embodiment includes E-test structures 206 positioned within the scribe lines 204 of the wafer. The preferred embodiment is further configured such that, selected signals, for example relating to the ID cell and other selected parameters, are made available at fixed geometric positions relative to the signals already used for E-testing. That is, by direct placement of the identifier cell 210 in a predetermined location or by the routing of the necessary signals from the identifier cell to the pads in the predetermined location, the identifier information may be extracted at the E-test step, instead of at wafer sort. Thus, large investments in wafer sort hardware on low volume products can be avoided. In one embodiment, the chip ID cell 210 is located in a corner of the die adjacent to the locations of the E-test structures 206. In an alternative embodiment, signals corresponding to a chip ID cell are made available at pads positioned in a corner of the die adjacent to the E-test structures 206. Preferably, the die will include pads to provide signals that correspond to a parameter being tested. For example, IDD reference cells may be positioned on the die to provide an indication of a supply current in a selected portion of the die.

Examples of suitable sample locations for IDD reference cells 208 are illustrated in FIG. 2B. The IDD reference cells 208, preferably are not positioned entirely in one corner of the die. That is, more effective readings are obtained if the IDD reference cells 208 are distributed evenly across the die as shown above. The IDD reference cells have been provided as illustrative of a test reference cell and are not intended to be limiting. For example, other test parameters such as Vdd, may be obtained using appropriate test cells.

The few signals needed to drive the IDD reference cell are easily routed and concentrated in the corner area shown, such that they may be driven at E-test at the same time that the E-test data is collected. In similar fashion, the identifier information for the die is preferably powered and collected through the interface of the E-test structure.

Preferably, the pads for the silicon ID signals and the reference IDD signals are not positioned in the scribe street but instead are preferably positioned close physically to the scribe street. This enables the E-test probe card to be configured with extra pins needed to support these two functional blocks of on-chip circuitry. Modifications to existing reticle databases to accommodate these changes are believed to be minimal. While it is recognized that e-test structures have in some cases been limited to one structure per reticle exposure, changes to a single E-test pattern for each die being tested is expected to be easily accomplished. Such a change would entail only a one-time change in the process reticle database, and as such would be easily amortized over all designs built on that process.

Figure 3:
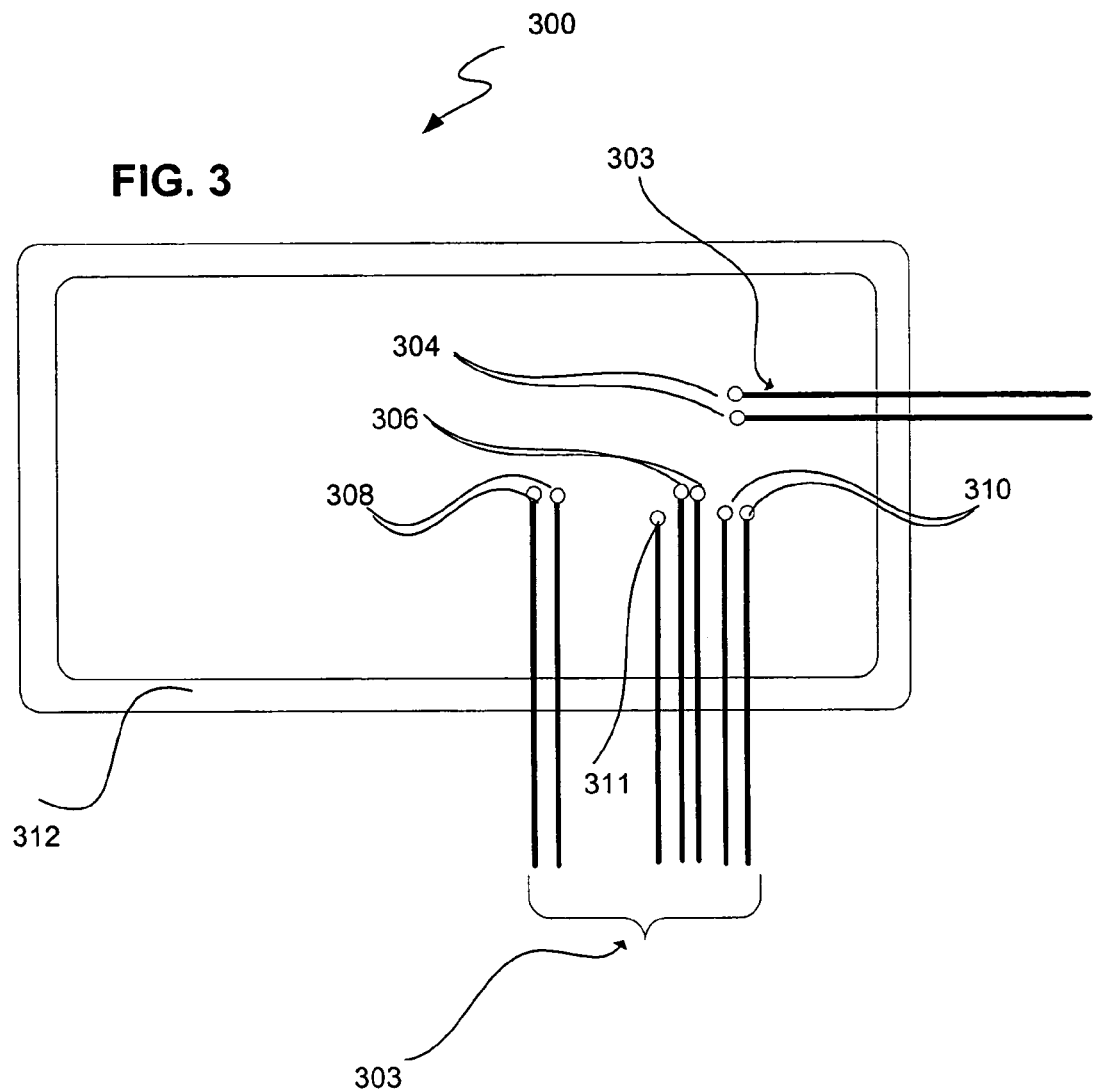
FIG. 3 is a diagram of a test fixture in accordance with one embodiment of the present invention.

FIG. 3 is a diagram of a test fixture in accordance with one embodiment of the present invention. The test fixture 300 includes a ring 312 provided for maintaining the probe tips 304, 306, 308, 310 and 311 in a predetermined position relative to standardized positions of the corresponding pads on the wafer. Each of the probe tips is attached to the end of a probe 303, the probes being attached to the ring 312, for example by using a conventional adhesive such as epoxy. The test fixture of the embodiment of the present invention is formed in accordance with conventional techniques for the formation of probe cards except for the configuration of the probe tips. Methods of manufacturing probe cards are well known to those of skill in the art and thus further description of the basic steps is deemed unnecessary here. The probe tips are configured to conform to a standardized position of selected pads on the wafer, for example in a preferred embodiment, the pads for an ID cell, a test cell, and e-test structures. For example, probe tips 304 and 310 are configured to match positions of corresponding pads of e-test structures located in the scribe street whereas probe tips 306 and 308 are configured to match corresponding pads on the active die portion, for example to obtain identification data and a limited set of test parameters Preferably, the probe tips provide electrical contact to at least an identifier cell so that the wafer probe step can be eliminated and the positioning of the die from a given wafer made available for final testing and statistical post processing.

Figure 4:
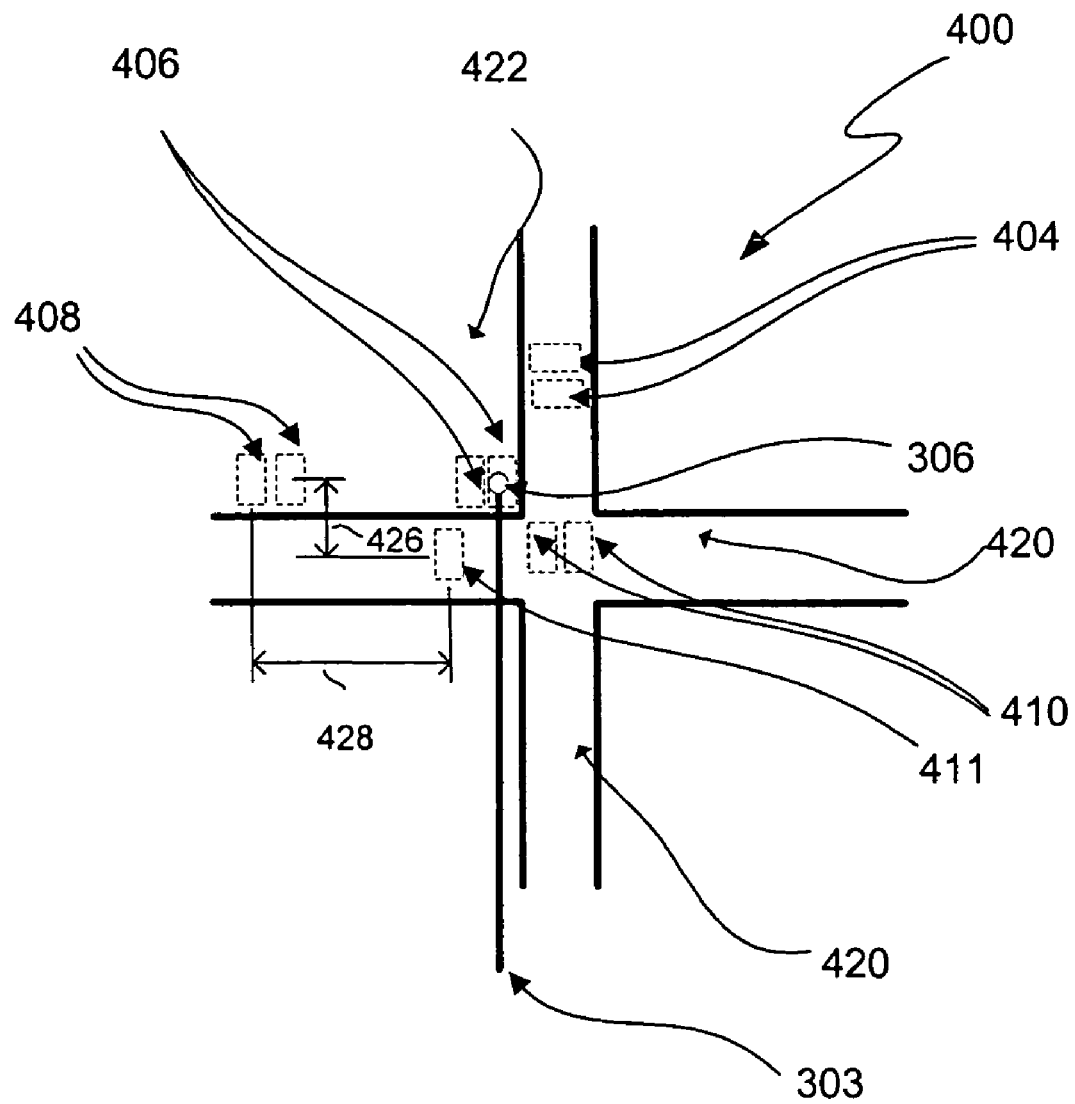
FIG. 4 is a diagram illustrating a configuration of the metallic pads of a wafer in accordance with one embodiment of the present invention.

FIG. 4 is a diagram illustrating a portion of a test fixture superimposed on the metallic pads of a wafer in accordance with one embodiment of the present invention. The techniques of the embodiments of the present invention are intended to provide a universal test fixture having probe tips that can be used to provide electrical contact with a variety of designs of the integrated circuits comprising a die, each of the die having selected pads placed in a standardized position such that the test fixture may be used to perform preliminary tests and obtain identification data from the die. For illustration purposes only, a probe 303 and probe tip 306 are shown superimposed on the wafer 400.

Wafer 400 includes active die portion 422 and scribe lines 420. Pads 404, 410, and 411 are shown located within the scribe lines 420 and correspond to the electrical test structures described above. Pads 406 and 408 are shown located within the active die portion 422 and preferably provide electrical connection to an ID cell and a reference test cell such as an IDD monitor cell. The pads 406 and 408, located within the active die portion 422, provide a set of signals in a fixed geometric position relative to the E-test structure pads 404, 410, and 411. That is, each of the test pads 406, 408 are located at a fixed vertical distance 426 and horizontal distance 428 in accordance with a predetermined layout so that the test fixture (probe card) can be reused over many designs. Thus, during E-testing, identification data and at least a minimized set of data, for example $I_{dd}$ data, can be obtained with a standardized test fixture.

Quiescent current or $I_{ddq}$ is the current required to power the CMOS integrated circuit after all logic transitions are made. In present CMOS integrated circuits, the magnitude of $I_{ddq}$ is commonly very small. However, when there is a defect such as a gate-to-source short, the quiescent current is one or more orders of magnitude higher. Thus, the quiescent current may be used to discriminate between good and bad die. Here, according to one embodiment, the quiescent current is measured simultaneously with E-test parameters by accessing reference test cells. Preferably, the performance test parameters (e.g., current) derived with the identification data are used in a post-processing step, i.e., after fabrication of the wafer is completed.

As can be appreciated, the amount of test data available during the preliminary testing such as simultaneous with the e-test data, is limited by the number of pads configured to correspond to the test fixture as illustrated in FIG. 3. Providing the pads in a fixed geometric relationship to the e-test pads permits the test fixture to be reusable over different designs. In contrast, current probe cards are typically customized for each new design, thus driving up costs. Preferably, the pads are configured in a standard configuration to match the most cost effective hardware solution. It is recognized that over time this configuration may change and accordingly the scope of the invention is intended to extend to the evolutions of an initially selected standard configuration as well as variations in the standard configuration as required to meet hardware requirements or technology differences and advances.

Figure 5:
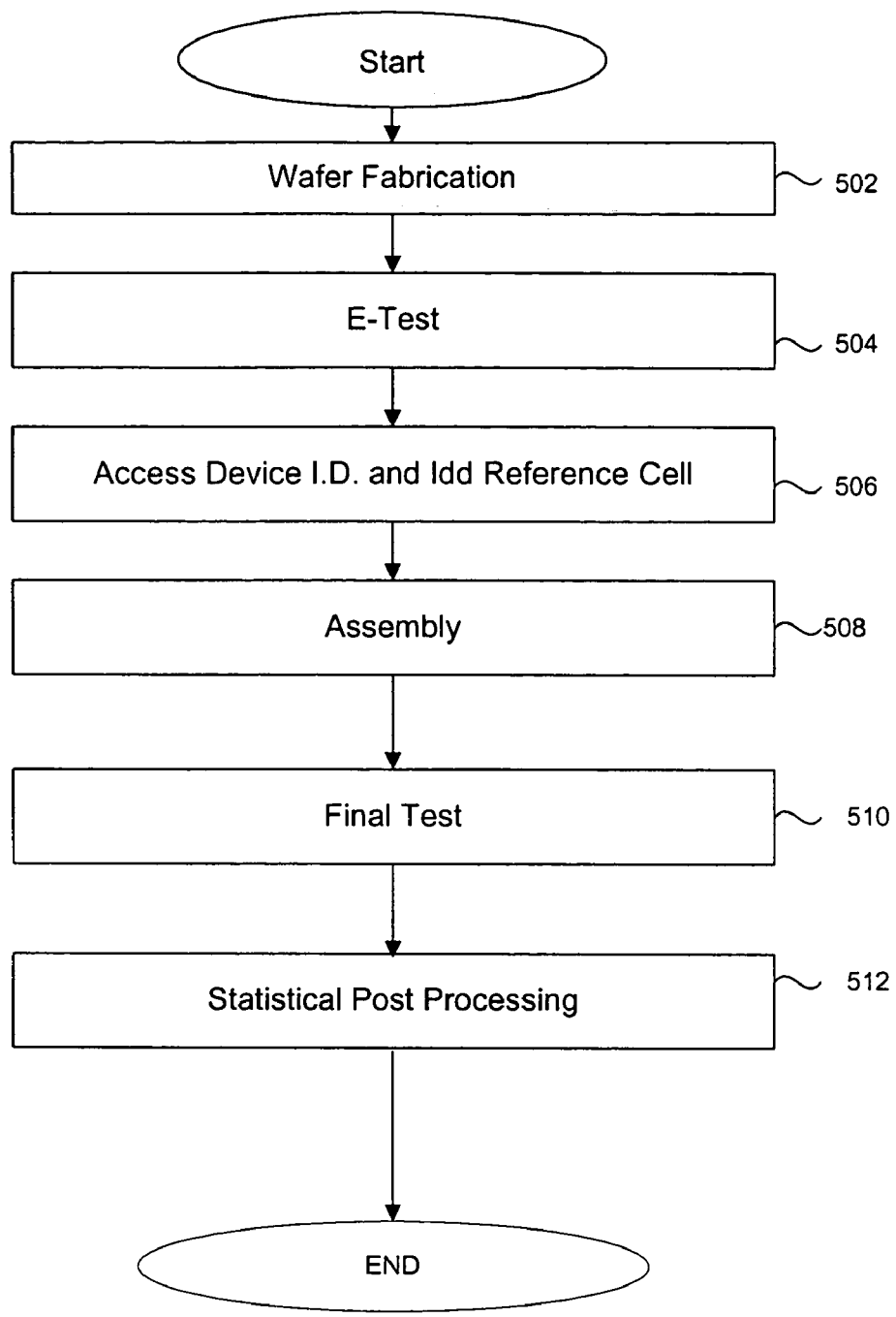
FIG. 5 is a flowchart illustrating steps in the manufacturing of a semiconductor integrated circuit in accordance with one embodiment of the present invention.

FIG. 5 is a flowchart illustrating steps in the manufacturing of a semiconductor integrated circuit in accordance with one embodiment of the present invention. During the wafer fabrication step 502, the individual dies are formed onto a semiconductor wafer.

Next, each of the e-test structures is individually tested in step 504 to provide information for control of the fabrication process. Using the same test fixture, the device I.D. data and reference test cell data is accessed, for example by allowing the fixture's probe tips to make electrical connection with unencapsulated pads on the wafer. This testing is performed before the individual dies are separated form the wafer. Preferably, the device I.D. data and test cell data is accessed simultaneous with the acquisition of e-test structure data although the invention is not so limited. That is, the scope of the invention is intended to also include accessing I.D. and test cell data either immediately before or after acquisition of the e-test data. The unencapsulated pads located in standardized positions in the active portion of the die and the scribe lines are accessed without undertaking a full wafer probe. Access is provided between the test fixture which makes electrical contact with the pads and the tester, preferably automated test equipment (ATE). The test fixture of the present embodiment thus acts as an interface between the metallic pads on the dies and the scribe lines and provides connections to the tester. The functional tester or automatic test equipment (ATE) is capable of reading the device identification data and the test cell data. This data and the identification information is preferably stored in the tester for use during statistical post processing steps.

Next, in step 508, the wafer is assembled. Initially, the wafer is diced, i.e., sawn along "streets" of the wafer to form individual die. The "streets" or scribe lines lie between each die and are used as cutting lines during the wafer sawing operation. During the assembly step, the die is separated from the wafer and packaged to form a device that can be attached and electrically connected to a printed circuit board, for example. Thus, the assembly operation includes a number of sub-steps such as wafer sawing, die attachment, and bonding.

During the final test operation 510, preferably the die functioning and other testing is performed. Typically a material handling system transfers packaged dies from their carriers, loads them into contacts or sockets on a load board. The functional tester or automatic test equipment (ATE) then functionally exercises the chip's designed features under software control to identify defective die.

Next, during a statistical post processing step 512, the correlated identification data and test data obtained simultaneously with the E-testing is used to determine device defects. For example, the identifier information may be used to trace die back to a particular wafer and to identify all dies from a particular wafer or production run as defective. Preferably, when the identification number is generated and read, as in step 506, the die's identification number is correlated with a physical location of the die an a particular wafer. Thus, in the post processing step, the correlated information is used to determine a wafer defect pattern. That is, post processing is used to determine chips that deviate from an expected distribution and using the deviation information and the fabricated location of dies on the wafer to predict other dies that are expected to be defective.

By avoiding the wafer probe step, the throughput of the testing process may be may be increased while decreasing costs.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for manufacturing a semiconductor integrated circuit, the method comprising:
   providing a wafer having a plurality of integrated circuit dies;
   using a test fixture to provide electrical contact with electrical testing structures located in a scribe line adjacent to a first of the plurality of integrated circuit dies; and
   monitoring the output of an identification cell located within the first of the plurality of integrated circuit dies by using the test fixture to provide contact with contacts on the wafer corresponding to the identification cell.

2. The method as recited in claim 1 wherein the contacts are electrically connected to the identification cell and positioned in a predetermined standardized geometric location relative to the electrical testing structures located in the scribe line.

3. The method as recited in claim 1 wherein the contacts are metallic pads.

4. The method as recited in claim 1 further comprising using the test fixture to access a contact on at least one of the plurality of integrated circuit dies to measure a performance parameter.

5. The method as recited in claim 4 wherein the performance parameter is one of a supply current and a supply voltage.

6. The method as recited in claim 4 wherein the performance parameter is a quiescent current.

7. The method as recited in claim 1, wherein the output of an identification cell provides a unique identification number for the cell and further comprising storing the identification number along with location data indicating the location of the first of the plurality of integrated circuit dies on the wafer.

8. The method as recited in claim 7 further comprising using the identification number and the location data in a post processing step to identify defects in the plurality of dies.

9. An integrated circuit test fixture configured for interconnection between a semiconductor tester and a wafer, comprising:
   a plurality of probe tips configured to provide electrical contact with a corresponding plurality of pads on a semiconductor wafer, wherein a first group of the plurality of pads comprises pads connected to an identification cell located within an integrated circuit die on the wafer and a second group of the plurality of pads is connected to an electrical testing structure located in a scribe line adjacent to the die.

10. The integrated circuit test fixture as recited in claim 9 wherein the plurality of pads are located in a corner of the integrated circuit die adjacent to the location of electrical testing structure located in a scribe line adjacent to the die.

11. The integrated circuit test fixture as recited in claim 9 wherein a third group of the plurality of pads is connected to a reference test cell located on the integrated circuit die and configured to measure an electrical parameter for the integrated circuit.

12. The integrated circuit test fixture as recited in claim 11 wherein the electrical parameter is a supply current.

13. The integrated circuit test fixture as recited in clam 9 wherein the plurality of probe tips are connected to a printed circuit board of the test fixture, the printed circuit board configured for electrical connection to a tester.

14. A method of manufacturing a semiconductor integrated circuit, the method comprising:
   providing a wafer having a plurality of dies;
   generating an identification number from an identification cell located on each of the plurality of dies;
   monitoring the identification number before separating the plurality of dies from the wafer by using a generic interface configured to access pads on a plurality of different integrated circuit designs; and
   using the monitored identification number in a statistical post processing to identify defects in any of the plurality of dies.

15. The method recited in claim 14, wherein the statistical post processing identifies wafer defect patterns.

16. The method recited in claim 15, further comprising correlating the monitoring identification number with a physical location of the die on the wafer and wherein the wafer defect patterns are determined using the identification number and the physical location of the die on the wafer.

17. The method recited in claim 15, wherein the generic interface is configured to conform to a standardized configuration of pads on the wafers.

18. The method recited in claim 15, wherein the test interface is configured to access e-test structure pads at the same time that the identification cell signals are monitored.

19. The method recited in claim 18, further comprising monitoring a signal from a reference test cell within at least one of the plurality of dies.

20. The method recited in claim 14 wherein the post processing occurs after the plurality of dies are separated from the wafer.

21. A method for manufacturing a semiconductor integrated circuit, the method comprising:
   providing a wafer having a plurality of integrated circuit dies;
   using a test fixture to provide electrical contact with electrical testing structures located in a scribe line adjacent to a first of the plurality of integrated circuit dies; and
   monitoring the output of an identification cell located within the first of the plurality of integrated circuit dies by using the test fire to provide contact with contacts on the wafer corresponding to the identification cell wherein the contacts are electrically connected to the identification cell and positioned in a predetermined standardized geometric location relative to the electrical testing structures located in the scribe line.

22. A method for manufacturing a semiconductor integrated circuit, the method comprising:
providing a wafer having a plurality of integrated circuit dies;
using a test fixture to provide electrical contact with electrical testing structures located in a scribe line adjacent to a first of the plurality of integrated circuit dies;
monitoring the output of an identification cell located within the first of the plurality of integrated circuit dies by using the test fixture to provide contact with contacts on the wafer corresponding to the identification cell; and
using the test fixture to access a contact on at least one of the plurality of integrated circuit dies to measure a performance parameter wherein the performance parameter at least one of a supply current, a supply voltage, and a quiescent current.

23. A method for manufacturing a semiconductor integrated circuit, the method comprising:
providing a wafer having a plurality of integrated circuit dies;
using a test fixture to provide electrical contact with electrical testing structures located in a scribe line adjacent to a first of the plurality of integrated circuit dies;
monitoring the output of an identification cell located within the first of the plurality of integrated circuit dies by using the test fixture to provide contact with contacts on the wafer corresponding to the identification cell thereby providing a unique identification number for the cell; and
storing the identification number along with location data indicating the location of the first of the plurality of integrated circuit dies on the wafer.

24. The method as recited in claim 23 further comprising using the identification number and the location data in a post processing step to identify defects in the plurality of dies.

* * * * *